US008635773B2

(12) United States Patent
Carter

(10) Patent No.: US 8,635,773 B2
(45) Date of Patent: Jan. 28, 2014

(54) SYSTEMS AND METHODS OF INSTALLING PHOTOVOLTAIC MODULES

(75) Inventor: Nicholas P. Carter, Santa Rosa, CA (US)

(73) Assignee: Nicholas Carter, San Carlos, CA (US)

(*) Notice: Subject to any disclaimer, the term of this patent is extended or adjusted under 35 U.S.C. 154(b) by 552 days.

(21) Appl. No.: 13/050,812

(22) Filed: Mar. 17, 2011

(65) Prior Publication Data

US 2011/0225825 A1 Sep. 22, 2011

Related U.S. Application Data

(60) Provisional application No. 61/314,815, filed on Mar. 17, 2010.

(51) Int. Cl.
*H01L 31/20* (2006.01)
*H01L 31/18* (2006.01)

(52) U.S. Cl.
USPC ............... 29/890.033; 29/824; 414/331.13; 414/222.11

(58) Field of Classification Search
CPC .................................. H01L 31/20; H01L 31/18
USPC .......... 29/890.033, 822–824; 414/780, 781, 414/313.13, 313, 222.1, 222.11, 222.04; 136/290, 245, 244; 198/300, 301
See application file for complete search history.

(56) References Cited

U.S. PATENT DOCUMENTS

| 6,105,242 | A | * | 8/2000 | Miyasaka et al. ............... 29/784 |
| 6,179,549 | B1 | * | 1/2001 | Hayakawa ................. 414/796.7 |
| 8,151,453 | B2 | * | 4/2012 | Garcia Tercero ............... 29/781 |
| 8,225,496 | B2 | * | 7/2012 | Bachrach et al. ............... 29/726 |
| 2009/0077804 | A1 | * | 3/2009 | Bachrach et al. ......... 29/890.033 |
| 2009/0211071 | A1 | * | 8/2009 | Lu et al. ....................... 29/25.01 |
| 2009/0287446 | A1 | * | 11/2009 | Wang et al. ................... 702/116 |
| 2010/0037932 | A1 | * | 2/2010 | Erez et al. ..................... 136/244 |

FOREIGN PATENT DOCUMENTS

DE  3238187 A1 * 4/1984 ............. H01L 31/18

* cited by examiner

*Primary Examiner* — David Bryant
*Assistant Examiner* — Jason L Vaughan
(74) *Attorney, Agent, or Firm* — Eric L. Lane; McKenna Long & Aldridge

(57) ABSTRACT

Systems and methods for the automated installation of solar (photovoltaic or PV) modules is disclosed. Embodiments comprise a conveyor system configured to support and deliver a plurality of photovoltaic modules, and a clampless mounting framework comprising an upper rail and a lower rail, the upper and lower rails configured and spaced apart to receive and secure a photovoltaic module. The mounting framework does not require clamps, so once the modules are delivered into place, physical installation is complete.

16 Claims, 6 Drawing Sheets

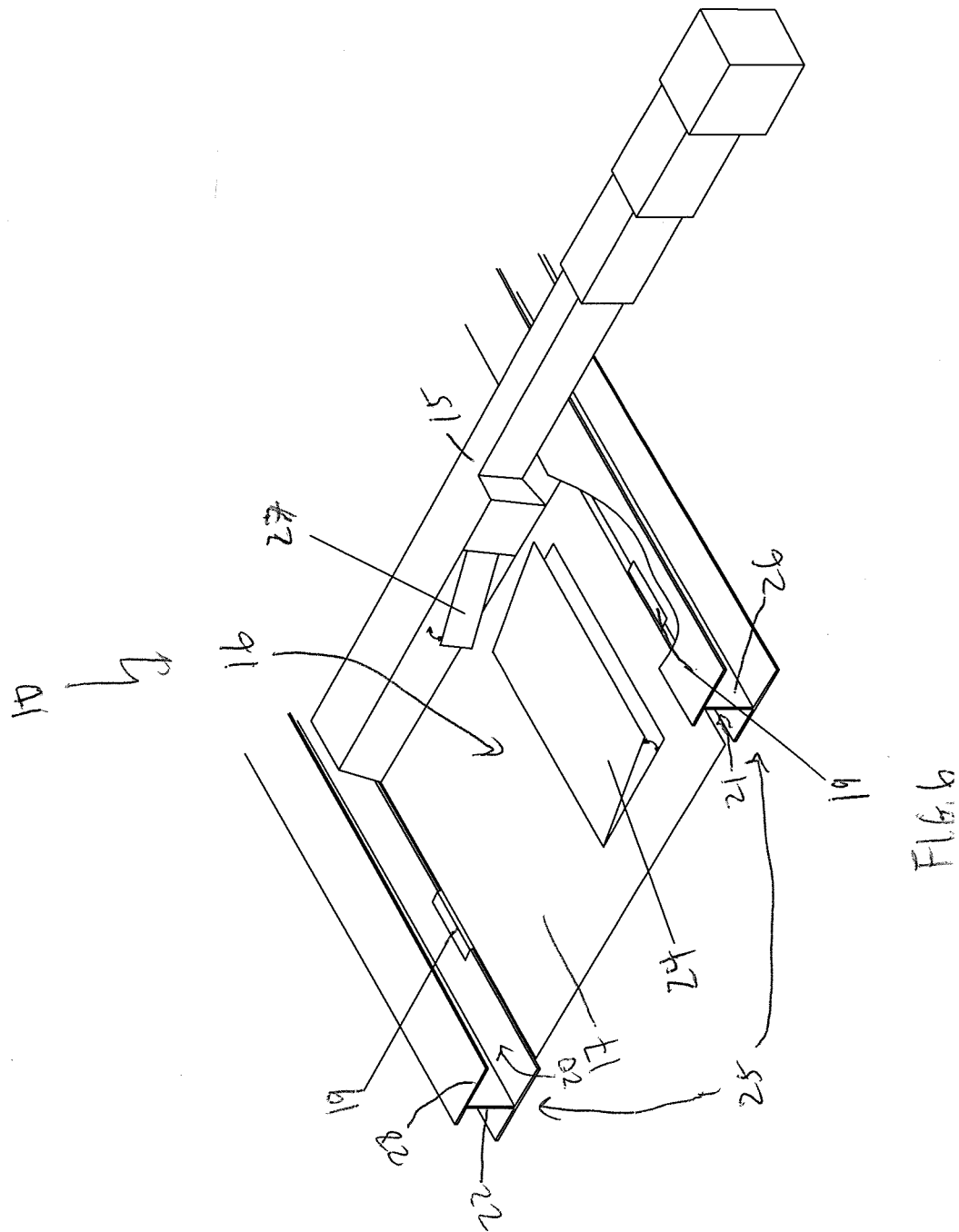

SYSTEMS AND METHODS OF INSTALLING PHOTOVOLTAIC MODULES

CROSS-REFERENCE TO RELATED APPLICATION

This application claims priority to U.S. patent application Ser. No. 61/314,815, filed Mar. 17, 2010, which is incorporated by reference herein in its entirety.

TECHNICAL FIELD

The disclosure relates to the field of solar power generation, specifically to the large-scale installation of solar electric (PV) modules.

BACKGROUND

PV systems consisting of numerous PV modules are being installed in growing numbers. Also growing rapidly is the number of modules used in such installations, up to tens of thousands or hundreds of thousands of modules in some cases.

SUMMARY

Embodiments of the disclosure automate the installation of PV modules, thus facilitating the module installation process, which is especially significant for these larger scale PV power plants.

In exemplary embodiments, systems for automated installation of photovoltaic modules comprise a conveyor system configured to support and deliver a plurality of photovoltaic modules and a clampless mounting framework comprising an upper rail and a lower rail. The upper and lower rails are configured and spaced apart to receive and secure a photovoltaic module. The upper rail and lower rail may be disposed approximately parallel to one another, or the upper rail may be disposed at a higher elevation than the lower rail.

The conveyor system may be configured to be repositionable to deliver the plurality of photovoltaic modules to a new location. The conveyor system may be disposed to introduce the photovoltaic module into the upper rail prior to introducing the photovoltaic module into the lower rail. The installation system may comprise a plurality of conveyor systems, and a second conveyor system is disposed approximately perpendicular to the first conveyor system.

The installation system may further comprise a mobile vehicle to support the conveyor apparatus. The installation system may further comprise a positioning mechanism to guide a photovoltaic module as it exits from a conveyor system. The positioning mechanism may include a damping apparatus. The positioning mechanism may further comprise a tie-in mechanism.

Exemplary embodiments include methods of installing photovoltaic modules, comprising placing one or more photovoltaic modules on a conveyor system and providing a clampless mounting framework having an upper rail and a lower rail such that the photovoltaic modules exit the conveyor system and slide into a channel defined by the upper and lower rails. The methods may further comprise guiding the photovoltaic modules from the conveyor system into the channel.

Exemplary embodiments of methods may further comprise slowing the photovoltaic modules using a damping apparatus. Methods may further comprise repositioning the conveyor system to deliver the photovoltaic modules to a new location. Methods may further comprise disposing a second conveyor system approximately perpendicular to the first conveyor system. Methods may further comprise using a mobile vehicle to support the conveyor system.

Exemplary embodiments of methods may further comprise disposing the upper rail and the lower rail approximately parallel to one another. Methods may further comprise disposing the upper rail at a higher elevation than the lower rail. Methods may further comprise disposing the conveyor system such that the photovoltaic modules are introduced into the upper rail prior to being introduced into the lower rail.

BRIEF DESCRIPTION OF THE DRAWINGS

In order that the disclosure may be readily understood, a description will be rendered by reference to specific embodiments thereof which are illustrated in the appended drawings. Understanding that these drawings depict only typical embodiments and are not therefore to be considered to be limiting of its scope, the disclosure will be described and explained with additional specificity and detail through the use of the accompanying drawings in which:

FIG. 6 is a perspective view of an exemplary embodiment of a positioning mechanism and a clampless mounting framework in accordance with the present disclosure.

DETAILED DESCRIPTION

In the following paragraphs, embodiments will be described in detail by way of example with reference to the accompanying drawings, which are not drawn to scale, and the illustrated components are not necessarily drawn proportionately to one another. Throughout this description, the embodiments and examples shown should be considered as exemplars, rather than as limitations of the present disclosure. As used herein, the "present disclosure" refers to any one of the embodiments described herein, and any equivalents. Furthermore, reference to various aspects of the disclosure throughout this document does not mean that all claimed embodiments or methods must include the referenced aspects.

Figure 1:
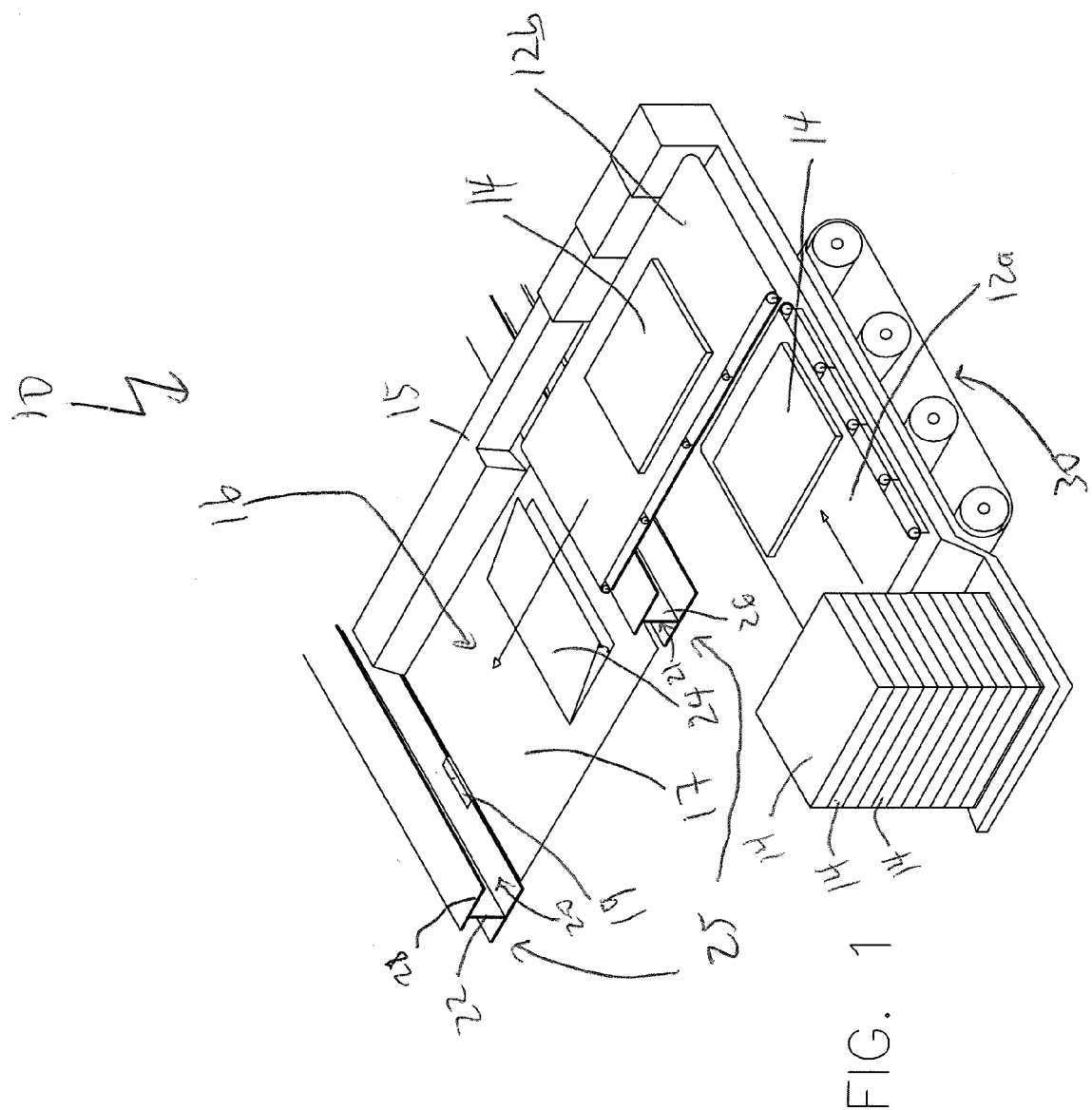
FIG. 1 is a perspective view of an exemplary embodiment of a system for installing PV modules in accordance with the present disclosure.
Figure 2:
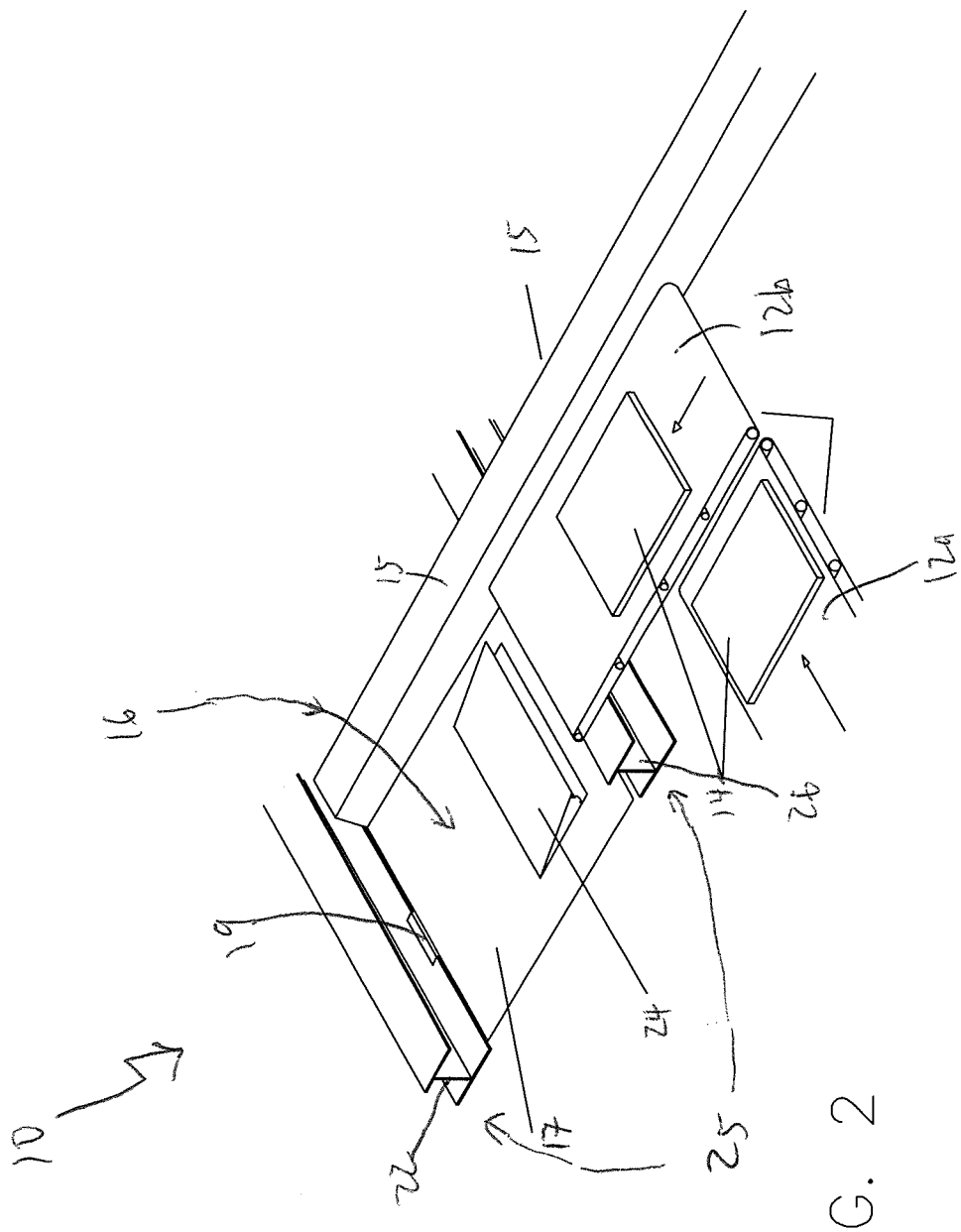
FIG. 2 is a perspective view of an exemplary embodiment of a system for installing PV modules in accordance with the present disclosure.

Referring to FIGS. 1-3 and 6, an exemplary embodiment of a system 10 for automated installation of solar (photovoltaic or PV) modules is illustrated. According to one implementation, the system 10 comprises a conveyor system 12b or systems 12a, 12b that deliver PV modules 14 into a mounting framework 25 comprised of upper and lower rails 22, 26. It should be noted that any type of conveyor system could be used, including a conveyor system using belts as shown in FIGS. 1-2 or a conveyance mechanism 18 including power roller units 32, as described with reference to FIGS. 4-5. The mounting framework 25 does not require clamps, so once the modules 14 are delivered into place, physical installation is complete.

A conveyor system 12 may deliver an individual PV module 14 into the rails of the clampless mounting framework 25. The conveyor system 12 may then be moved sideways and the process repeated in order to install subsequent modules. The same process can be used for multiple rows of PV modules 14 by repositioning the mounting arm 15 of the apparatus and again moving along the row, installing one panel at a time. The mounting arm 15 may be of telescopic construction, allowing extension and retraction of the arm.

A positioning mechanism 16 guides the PV modules 14 into the clampless mounting framework 25. The positioning mechanism 16 may include one or more of the following components. The positioning mechanism 16 may include support tray 17 and a tie-in mechanism 19. The tie-in mechanism 19 comprises a lip or lips located at opposite edges of the support tray 17 in order to position the feed mechanism support tray 17 in the right position to enable the module 14 to feed into mounting rails 22, 26 of the mounting framework 25. The positioning mechanism 16 may also include a damping apparatus 24 and adjustment tab 27, as described in more detail below.

Figure 3:
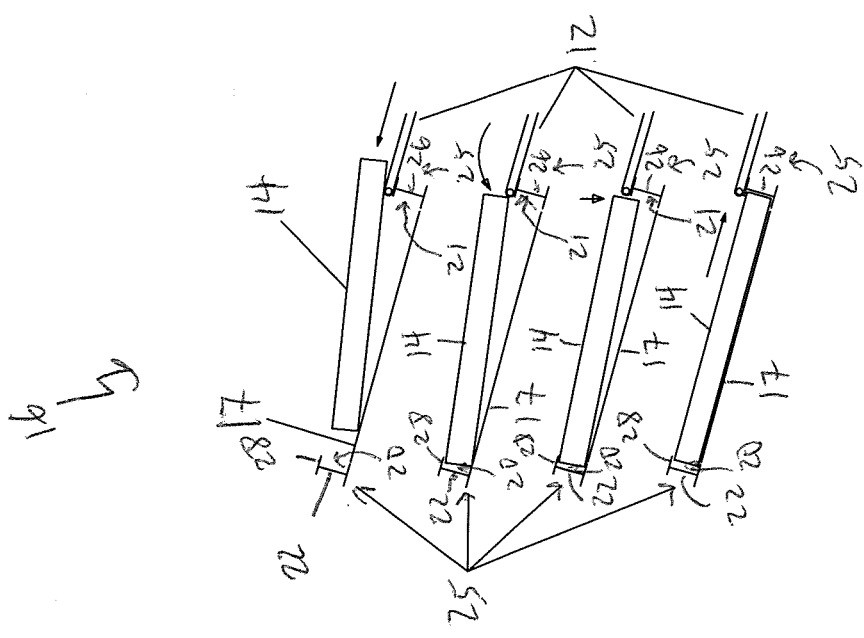
FIG. 3 is a cross-sectional view of a PV module being inserted into an exemplary embodiment of a mounted framework in accordance with the present disclosure.

Referring to FIG. 3, a detailed cross-section (not to scale) is shown of the PV module 14 being inserted within the mounting framework 25 in the figure. The PV module exits off the conveyor system 12 and is guided smoothly into the channel 20 within the upper mounting rail 22 by the support tray 17 and the damping apparatus 24, which may be a plate attached to the mounting arm 15 (shown in FIGS. 1, 2, 5 and 6) that is engaged with the upper rail 22. As the top of the PV module 14 is sliding into the channel 20 within the upper mounting rail 22, the bottom of the PV module comes off the conveyor 12 and, slowed by the damping plate 24 shown in FIGS. 1 and 2, it is lowered until it aligns with the channel 21 in the lower mounting rail 26. The PV module 14 then slides down either under its own weight or with the guidance of the positioning mechanism 16 built into the installation system 10 until it is snugly positioned in the lower rail 26.

More particularly, adjustment tab 27 pushes the module 14 sideways to sit snugly against the previous module, thereby aligning it with the previous module already sited between the rails 22, 26. The upper and lower rails 22, 26 of the mounting framework 25 are spaced so that the module is still restrained by the top lip 28 of the upper rail 22. The upper and lower rails 22, 26 may be configured with cross sectional I shapes, as shown, or as inverted-T shapes. In the inverted T-shape, a cap may later be disposed along the upper surface of the rails to retain the PV modules.

The modules 14 can be fed from a second, extending, conveyor structure 12a which runs along the row formed by the mounting framework 25 and then engages with the conveyor 12b described in the specification. Workers can then feed modules 14 onto the second conveyor 12a, at the end of the row, and the installation system 10 will automatically install them, progressing down the row. One suggested mounting mechanism for the system would be on a mobile vehicle 30, such as the tracked entity shown in FIGS. 1 and 5, which is shown configured with a stack of modules 14 and would require workers to load modules from the stack onto the second conveyor. Another worker would deliver batches of modules to replenish the stack, typically by fork-lift.

Figure 4:
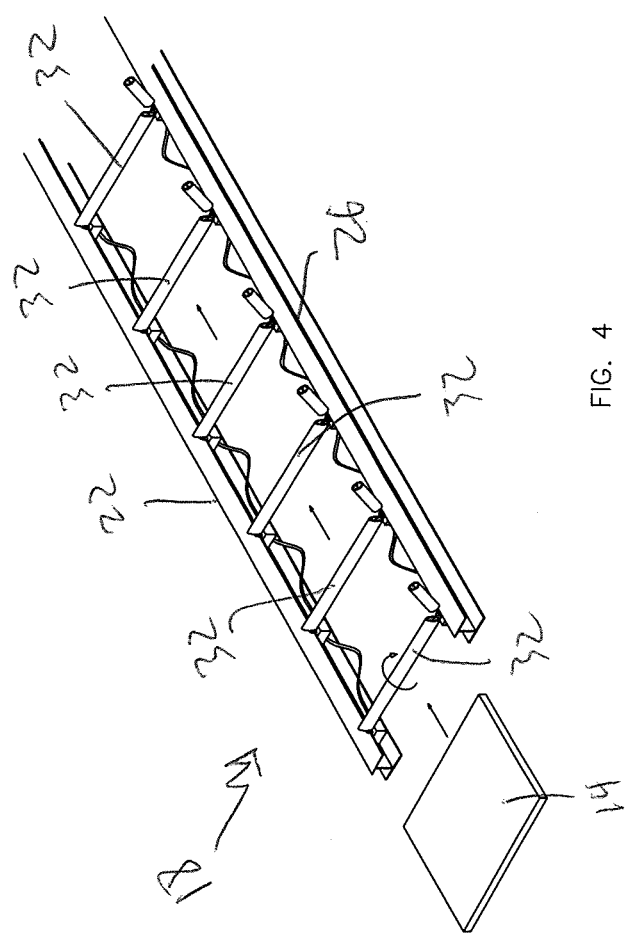
FIG. 4 is a perspective view of an exemplary embodiment of a system for installing PV modules in accordance with the present disclosure.
Figure 5:
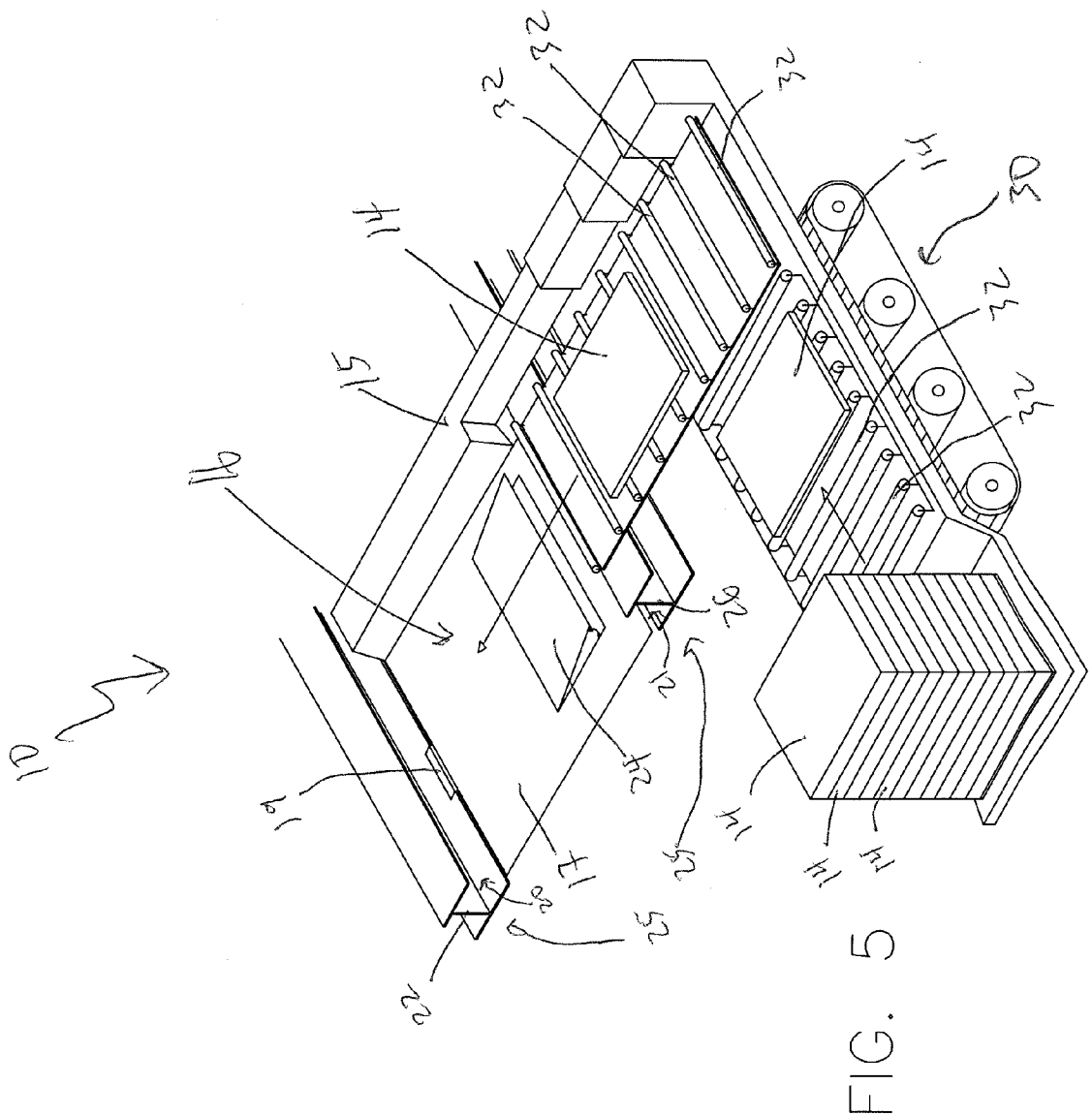
FIG. 5 is a perspective view of an exemplary embodiment of a system for installing PV modules in accordance with the present disclosure.

Referring to FIGS. 4-5, an exemplary embodiment of a conveyance mechanism 18 is shown. Instead of using a conveyor system with a belt, as shown in FIGS. 1 and 2, roller units 32 are temporarily located between upper and lower rails 22, 26. During installation, PV modules 14 roll down the roller units 32 temporarily inserted into the upper and lower rails 22, 26. The PV modules 14 may then be installed by the same conveyor/plate mechanism at the end as discussed above. The roller units 32 provide a temporary conveyor so that the PV modules 14 can be installed working back towards the start point and removing the roller units as installation progresses. If there are multiple rows of modules within the racking structure, the roller units 32 could be swapped to the adjacent row. So as one row set gets shorter the next row grows for installation of the next row of modules.

Thus, it is seen that installation systems and methods are provided. It should be understood that any of the foregoing configurations and specialized components may be interchangeably used with any of the apparatus or systems of the preceding embodiments. Although illustrative embodiments are described hereinabove, it will be evident to one skilled in the art that various changes and modifications may be made therein without departing from the scope of the disclosure. It is intended in the appended claims to cover all such changes and modifications that fall within the true spirit and scope of the disclosure.

What is claimed is:

1. A system for automated installation of a plurality of photovoltaic modules into a clampless mounting framework, comprising:
    a clampless mounting framework;
    a conveyor system supporting a plurality of photovoltaic modules and delivering the plurality of photovoltaic modules to the clampless mounting framework; and
    a mobile vehicle supporting the conveyor system and positioning the conveyor system relative to the clampless mounting framework such that the plurality of photovoltaic modules are delivered to more than one location along the clampless mounting framework;
    the clampless mounting framework comprising an upper rail and a lower rail, the upper and lower rails receiving and securing the plurality of photovoltaic modules after the plurality of photovoltaic modules have been delivered by the conveyor system.

2. The system of claim 1, wherein the upper rail and lower rail are disposed approximately parallel to one another.

3. The system of claim 1, wherein the upper rail is disposed at a higher elevation than the lower rail.

4. The system of claim 1, wherein the conveyor system is disposed to introduce the photovoltaic module into the upper rail prior to introducing the photovoltaic module into the lower rail.

5. The system of claim 1, further comprising a plurality of conveyor systems.

6. The system of claim 5, wherein a second conveyor system is disposed approximately perpendicular to the first conveyor system.

7. The system of claim 1, further comprising a positioning mechanism to guide a photovoltaic module as it exits from a conveyor system.

8. The system of claim 7, wherein the positioning mechanism includes a damping apparatus.

9. The system of claim 7 wherein the positioning mechanism includes a tie-in mechanism.

10. A method of installing a plurality of photovoltaic modules into a clampless mounting framework, comprising:
    placing plurality of photovoltaic modules on a conveyor system, the conveyor system supporting a plurality of photovoltaic modules and delivering the plurality of photovoltaic modules to a clampless mounting framework, the clampless mounting framework including an upper rail and a lower rail;

positioning the conveyor system relative to the clampless mounting framework using a mobile vehicle such that the plurality of photovoltaic modules are delivered to more than one location along the clampless mounting framework; and receiving and securing the plurality of photovoltaic modules into a channel defined by the upper and lower rails after the plurality of photovoltaic modules have been delivered by the conveyor system.

11. The method of claim 10 further comprising guiding the photovoltaic modules from the conveyor system into the channel.

12. The method of claim 10 further comprising slowing the photovoltaic modules using a damping apparatus.

13. The method of claim 10, further comprising disposing a second conveyor system approximately perpendicular to the first conveyor system.

14. The method of claim 10 further comprising disposing the upper rail and the lower rail approximately parallel to one another.

15. The method of claim 10 further comprising disposing the upper rail at a higher elevation than the lower rail.

16. The method of claim 10 further comprising disposing the conveyor system such that the photovoltaic modules are introduced into the upper rail prior to being introduced into the lower rail.

* * * * *